(12) United States Patent
Glaser et al.

(10) Patent No.: US 6,819,571 B2
(45) Date of Patent: Nov. 16, 2004

(54) CIRCUIT CARDS HAVING A SINGLE GROUND PLANE WITH LOGIC DEVICES CONNECTED THERETO

(75) Inventors: Donald J. Glaser, Huntington Beach, CA (US); Douglas G. Gilliland, Santa Ana, CA (US); Dennis J. Vandenberg, Placentia, CA (US)

(73) Assignee: ADC DSL Systems, INc., Eden Prairie, MN (US)

( * ) Notice: Subject to any disclaimer, the term of this patent is extended or adjusted under 35 U.S.C. 154(b) by 49 days.

(21) Appl. No.: 10/128,791

(22) Filed: Apr. 22, 2002

(65) Prior Publication Data

US 2003/0198035 A1 Oct. 23, 2003

(51) Int. Cl.[7] .............................. H05K 7/02; H05K 7/06; H05K 7/08; H05K 7/10
(52) U.S. Cl. ...................... 361/780; 361/775; 361/788
(58) Field of Search .................. 361/730–733, 361/748, 752–753, 772–788, 800–803, 816–818, 799, 794, 795, 212, 220; 174/51; 439/61, 799; 307/112, 139, 119, 150

(56) References Cited

U.S. PATENT DOCUMENTS

| | | | |
|---|---|---|---|
| 4,697,858 A | * 10/1987 | Balakrishnan | 439/61 |
| 4,904,968 A | * 2/1990 | Theus | 333/246 |
| 5,321,663 A | * 6/1994 | Nishi | 365/229 |
| 5,526,217 A | * 6/1996 | Gormley et al. | 361/119 |
| 5,543,999 A | * 8/1996 | Riley | 361/119 |
| 5,831,351 A | * 11/1998 | Khosrowpour et al. | 307/139 |
| 6,151,202 A | * 11/2000 | Mueller et al. | 361/212 |

FOREIGN PATENT DOCUMENTS

JP  03022499 A  * 1/1991  ............ H05K/9/00

* cited by examiner

*Primary Examiner*—Evan Pert
*Assistant Examiner*—Tuan Dinh
(74) *Attorney, Agent, or Firm*—Fogg and Associates, LLC; Laura A. Ryan

(57) ABSTRACT

A circuit card that includes a single ground plane connectable to a chassis-ground and a logic device having a ground pin connected to the single ground plane. The connection between the ground pin and the single ground plane provides a direct path between the logic device and the chassis-ground. A power supply is connected to an input pin of the logic device for providing a logic voltage to the logic device. The power supply is connectable to a battery.

22 Claims, 3 Drawing Sheets

CIRCUIT CARDS HAVING A SINGLE GROUND PLANE WITH LOGIC DEVICES CONNECTED THERETO

TECHNICAL FIELD

The present invention relates generally to the field of circuit cards and, in particular, to circuit cards having a single ground plane with logic devices connected thereto.

BACKGROUND

Three-ground electrical systems, such as many circuit cards deployed in central offices or remote units of telecommunications systems or the like, are often connected to two-ground electrical systems, such as telecommunications systems. For example, some three-ground circuit cards have a logic-ground plane to which ground pins of logic devices of the circuit card are connected, a separate chassis-ground plane, and a battery-return of a power supply of the circuit card, e.g., a DC-to-DC power supply or converter for providing voltages to the logic devices. Telecommunications systems typically have a chassis-ground, e.g., a housing (or rack) of a central office, remote unit, or the like for containing the circuit cards connected to earth ground, and a battery-return connected to the chassis-ground at a single location.

One method for connecting three-ground circuit cards to two-ground telecommunications systems involves using a circuit card having the logic-ground plane connected to the battery-return of the circuit card and having the logic-ground capacitively coupled to the chassis-ground plane of the circuit card using one or more relatively high-voltage capacitors. The chassis-ground plane is connected to the chassis-ground of the telecommunications system and the battery-return of the circuit card is connected to the battery return of the telecommunications system.

One problem with this method of connection is that many of the logic devices of the circuit card are susceptible to electrostatic discharge (ESD), and the capacitive coupling to the chassis-ground plane and thus earth ground does not provide a clear, low-impedance path for the ESD to go to earth ground. Moreover, logic devices often generate electromagnetic interference (EMI). Again, the capacitive coupling to the chassis-ground plane and thus earth ground does not provide a direct, low-impedance path for the EMI to go to earth ground. Therefore, the EMI can radiate, often affecting the performance of other equipment of the telecommunications system.

For the reasons stated above, and for other reasons stated below that will become apparent to those skilled in the art upon reading and understanding the present specification, there is a need in the art for alternatives to circuit cards having two separate ground planes where one of the ground planes is connected to a battery-return and is capacitively coupled to the other ground plane.

SUMMARY

The above-mentioned problems with circuit cards having two separate ground planes where one of the ground planes is connected to a battery-return and is capacitively coupled to the other ground plane and other problems are addressed by embodiments of the present invention and will be understood by reading and studying the following specification.

In one embodiment, an electronic system is provided. The electronic system has a chassis-ground. The electronic system includes one or more circuit cards. Each of the one or more circuit cards includes a single ground plane connected to the chassis-ground and a logic device having a ground pin connected to the single ground plane. The connection between the ground pin and the single ground plane provides a direct path between the logic device and the chassis-ground. The one or more circuit cards are adapted to a connect to a battery, where the battery is connected to the chassis-ground.

In another embodiment, a circuit card is provided. The circuit card includes a single ground plane connectable to a chassis-ground and a logic device having a ground pin connected to the single ground plane. The connection between the ground pin and the single ground plane provides a direct path between the logic device and the chassis-ground. A power supply is connected to an input pin of the logic device for providing a logic voltage to the logic device. The power supply is connectable to a battery.

In another embodiment, a method for grounding a logic device of a circuit card is provided. The method includes connecting a ground pin of the logic device to a single ground plane of the circuit card and connecting the single ground plane of the circuit card to a chassis-ground. Connecting the ground pin of the logic device to the single ground plane of the circuit card and connecting the single ground plane of the circuit card to the chassis-ground provides a direct path between the logic device and the chassis-ground.

In yet another embodiment, a method for manufacturing a circuit card is provided. The method includes disposing a logic device on a substrate and disposing a single ground plane within the substrate. The single ground plane is connectable to a chassis-ground. Connecting a ground pin of the logic device to the single ground plane is also included in the method. Connecting the ground pin of the logic device to the single ground plane provides a direct path between the logic device and the chassis-ground.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention involve connecting logic components to a single ground plane of a circuit board connectable to a chassis-ground of a housing to ground the logic components to the chassis-ground. Advantageously, this provides a direct, lower impedance path between the logic components and earth ground for ESD and EMI as compared to conventional situations that involve connecting logic devices to one ground plane of a circuit card, connecting the ground plane to a battery-return of the circuit card, and capacitively coupling the ground plane to another separate ground plane connectable to a chassis-ground. This also eliminates one or more relatively high-voltage capacitors that would otherwise be used to couple the separate ground planes together.

Figure 1:
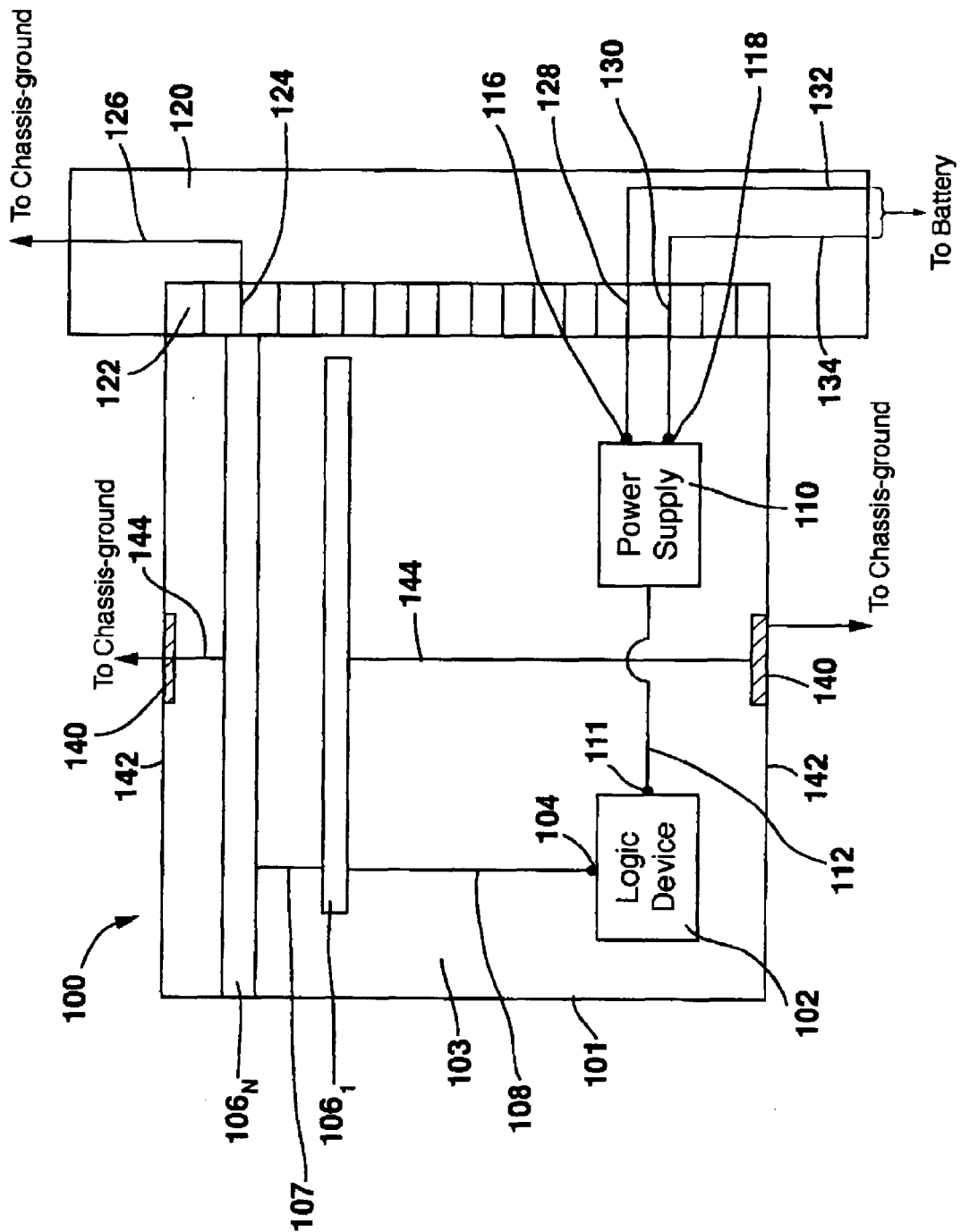
FIG. 1 is a plan view of a circuit card according to an embodiment of the present invention.

FIG. 1 is a plan view of a circuit card 100, such as a circuit card for a telecommunications system, according to an embodiment of the present invention. Circuit card 100 includes a logic device 102 disposed on a surface 103 of a substrate 101 of circuit card 100. Circuit card 100 includes electrically interconnected conductive layers $106_1$ to $106_N$ disposed on surface 103. In one embodiment, conductive traces, such as conductive trace 107, electrically interconnect conductive layers 106. Logic device 102 has a ground pin 104 connected to conductive layers 106, such as at conductive layer $106_1$. In one embodiment, a conductive trace 108 disposed on surface 103 interconnects pin 104 to conductive layer $106_1$. Conductive layers 106 are connectable to a chassis-ground of an electronic system, such as a housing of a telecommunications system for containing circuit cards. This enables conductive layers 106 to act as a single ground plane of circuit card 100. In one embodiment, the single ground plane comprises one or more of conductive layers 106, conductive trace 107 and conductive trace 108. Connecting ground pin 104 to conductive layers 106 and thus the single ground plane of circuit card 100 provides a direct path between logic device 102 and chassis-ground and thus earth ground for ESD and EMI.

In one embodiment, circuit card 100 also includes a power supply 110 disposed on surface 103 of substrate 101. In one embodiment, power supply 110 is a DC-to-DC power supply that converts a battery voltage, e.g., 48 volts, to a logic voltage, e.g., 3.3 or 5 volts. Power supply 110 is connected to an input pin 111 of logic device 102, e.g., by a conductive trace 112 of circuit board 100, for supplying a logic voltage to logic device 102. Power supply 110 includes a battery pin 116 and a battery-return pin 118 that are connectable, for example, to a battery of a telecommunications system. The term "pin" should not be limited to a specific physical design, but is intended to represent any electrical interconnection.

In one embodiment, circuit card 100 is connected to a backplane 120 by an edge connector 122 of circuit card 100. A ground pin 124 disposed on edge connector 122 is connected to conductive layers 106 at one of conductive layers 106, such as conductive layer $106_N$. In one embodiment, a trace 126 of backplane 120 connects ground pin 124 and thus the single ground plane to chassis-ground. In another embodiment, battery pin 116 and battery-return pin 118 are respectively connected to battery pin 128 and battery-return pin 130 of edge connector 122. In this embodiment, conductors 132 and 134 of backplane 120 respectively connect battery pin 128 and battery-return pin 130 of edge connector 122 to a battery.

In one embodiment, a conductive strip 140 is disposed on surface 103 adjacent one or both of sides 142 of substrate 101 of circuit card 100. In another embodiment, conductive strip 140 is connected to conductive layers 106 and thus the single ground plane by a conductive trace 144. In one embodiment, conductive trace 144 comprises a conductive layer. In this embodiment, conductive layers 106 are connected to chassis-ground by forming electrical contact between conductive strip 140 and a housing for containing circuit card 100, e.g., by sliding circuit card 100 into a slot of the housing. In other embodiments, the single ground plane comprises conductive trace 144.

Figure 2:
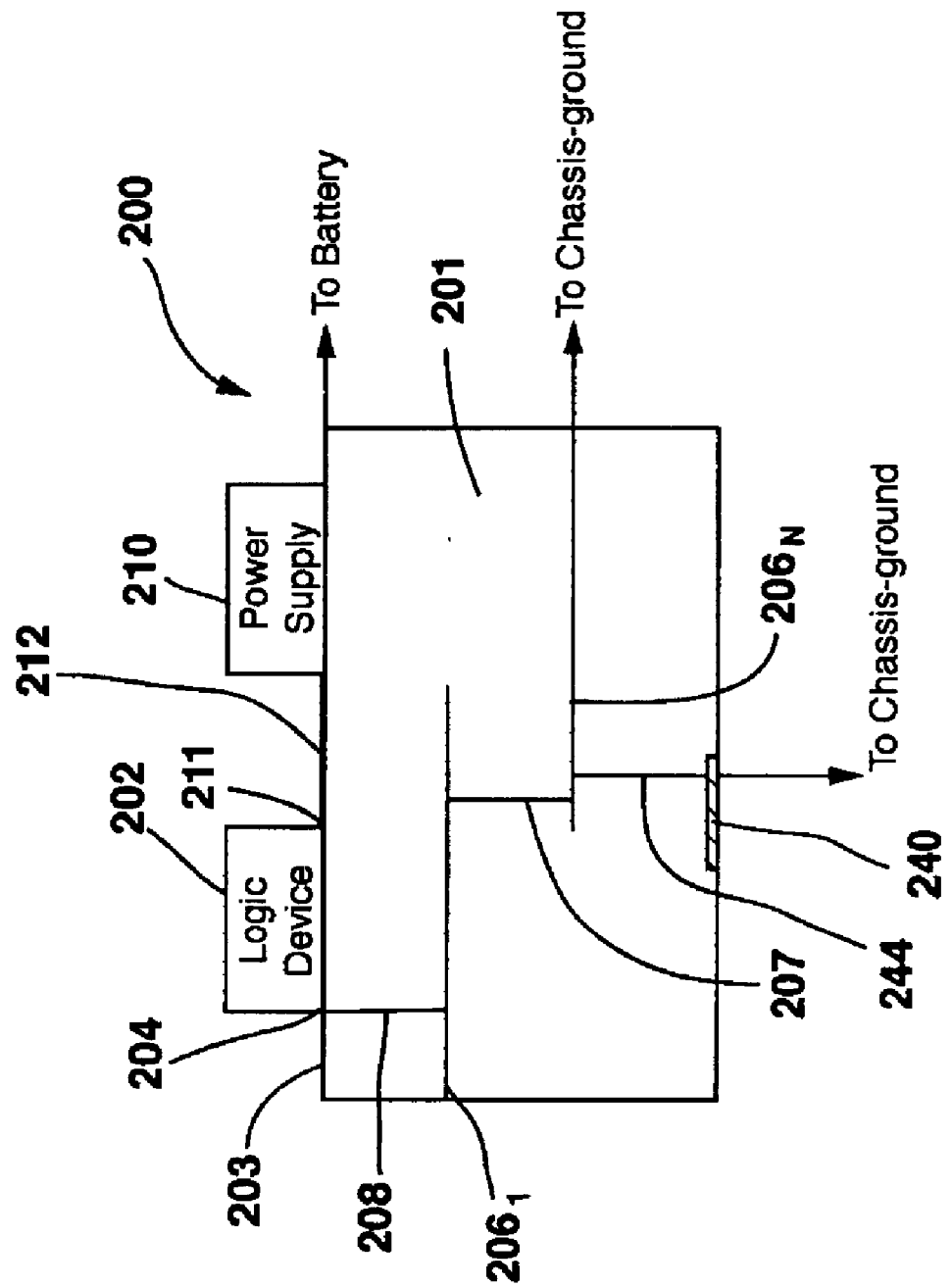
FIG. 2 is a cross-sectional view of a circuit card according to another embodiment of the present invention.

FIG. 2 is a cross-sectional view of a circuit card 200, such as a circuit card for a telecommunications system, according to another embodiment of the present invention. Circuit card 200 includes a logic device 202 disposed on a surface 203 of a substrate 201 of circuit card 200. Circuit card 200 includes electrically interconnected conductive layers $206_1$ to $206_N$ disposed within or on substrate 201. In one embodiment, conductive traces, such as conductive trace 207, electrically interconnect conductive layers 206. Logic device 202 has a ground pin 204 connected to conductive layers 206, such as at conductive layer $206_1$. In one embodiment, a conductive trace 208 disposed within substrate 201 interconnects pin 204 to conductive layer $206_1$. Conductive layers 206 are connectable to a chassis-ground of an electronic system, e.g., at conductive layer $206_N$, such as a housing of a telecommunications system for containing circuit cards. This enables conductive layers 206 to act as a single ground plane of circuit card 200. In one embodiment, the single ground plane comprises one or more of conductive layers $206_1$ to $206_N$, trace 207, and trace 208.

In various embodiments, a conductive strip 240 is disposed on substrate 201 of circuit card 200. In another embodiment, conductive strip 240 is connected to conductive layers 206 and thus the single ground plane by a conductive trace 244. In this embodiment, conductive layers 206 are connected to chassis-ground by forming electrical contact between conductive strip 240 and a housing for containing circuit card 200, e.g., by sliding circuit card 200 into a slot of the housing. In another embodiment, conductive layers 206 are connected to chassis-ground by connecting circuit card 200 to a backplane, such as backplane 120 of FIG. 1, so that a pin of an edge connector of circuit card 200 is connected to chassis-ground by a trace in the backplane, as described above for FIG. 1.

In one embodiment, circuit card 200 includes a power supply 210 disposed on surface 203 of substrate 201. In one embodiment, power supply 210 is as described above for circuit card 100 of FIG. 1. Power supply 210 is connected to an input pin 211 of logic device 202, e.g., by a trace (or conductive layer) 212 of circuit board 200, for supplying a logic voltage to logic device 202. Power supply 210 is connectable, for example, to a battery of a telecommunications system.

Figure 3:
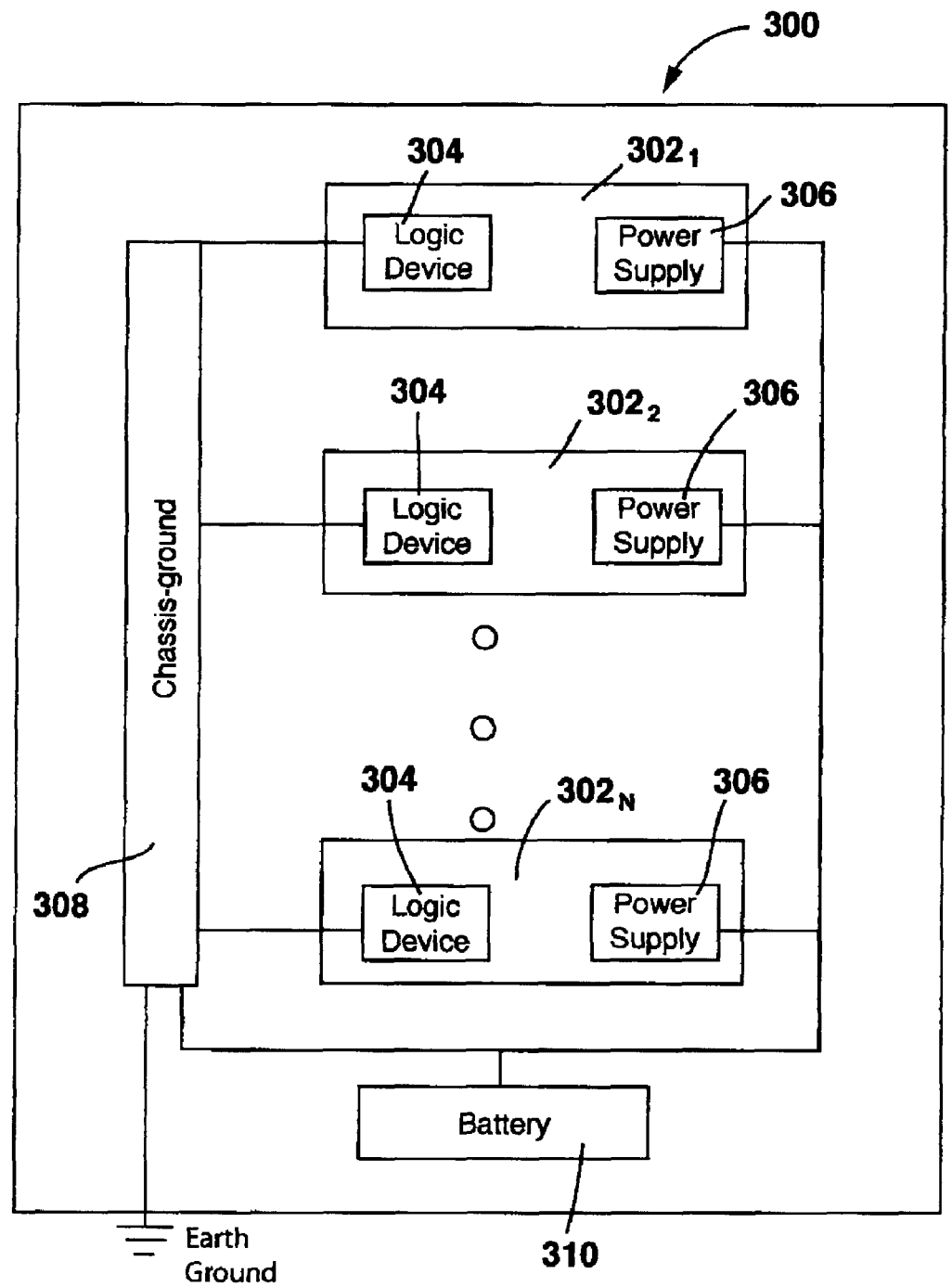
FIG. 3 is a block diagram of an electronic system according to another embodiment of the present invention.

FIG. 3 is a block diagram of an electronic system 300, such as a central office of a telecommunications system, according to another embodiment of the present invention. Electronic system 300 includes circuit cards $302_1$ to $302_N$, such as line cards, management cards, or the like. In one embodiment, each of circuit cards $302_1$ to $302_N$ is as described above for circuit card 100 of FIG. 1. In another embodiment, each of circuit cards $302_1$ to $302_N$ is as described above for circuit card 200 of FIG. 2. Each of circuit cards $302_1$ to $302_N$ includes a logic device 304 and a power supply 306. Each of circuit cards 302 has a single ground plane, such as described above for circuit card 100 or 200. In one embodiment, the single ground plane of each of circuit cards 302 includes one or more of the conductive planes 106, conductive trace 107, and conductive trace 108 of circuit card 100 and the conductive planes 206, conductive trace 207, and conductive trace 208 of circuit card 200. The logic device 304 of each of circuit cards 302 is connected to the single ground plane of each of circuit cards 302. The single ground plane of each of circuit cards 302 is connected to a chassis-ground 308, e.g., a housing (or rack) for containing circuit cards 302 or the like connected to earth ground. A battery 310 or the like is connected to power supply 306 of each of circuit cards 302. Battery 310 is also connected to chassis-ground 308. In one embodiment, electronic circuit cards 302 are connected to a backplane, such as backplane 120 of FIG. 1.

CONCLUSION

Embodiments of the present invention have been described. The embodiments provide for connecting logic components to a single ground plane of a circuit board connectable to a chassis-ground to ground the logic components to the chassis-ground. Advantageously, this provides a direct, lower impedance path between the logic components and earth ground for ESD and EMI as compared to conventional situations that involve connecting logic devices to one ground plane of a circuit card, connecting the ground plane to a battery-return of the circuit card, and capacitively coupling the ground plane to another separate ground plane connectable to a chassis-ground. This also eliminates one or more relatively high-voltage capacitors that would otherwise be used to couple the separate ground planes together.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, conductive strip 140 may be disposed on one or both of sides 142 of substrate 101 instead of surface 103 of substrate 101. Moreover, in some embodiments, only a single conductive strip 140 is disposed on surface 103 of substrate 101 instead of two conductive strips 140, as shown in FIG. 1. Conductive layers 106 of electronic circuit card 100 of FIG. 1 can be connected to chassis ground via ground pin 124 only, via one or both of conductive strips 140 only, or via ground pin 144 in combination with one or both of conductive strips 140. In one embodiment, a circuit card can have a single ground plane comprising one or more of the conductive planes 106, conductive trace 107, and conductive trace 108 of circuit card 100 and the conductive planes 206, conductive trace 207, and conductive trace 208 of circuit card 200. Moreover, It is manifestly intended that this invention be limited only by the following claims and equivalents thereof.

What is claimed is:

1. An electronic system comprising:
 a chassis-ground;
 one or more circuit cards, each comprising a single ground plane connected to the chassis-ground and a logic device having a ground pin connected to the single ground plane, wherein the connection between the ground pin and the single ground plane provides a direct path between the logic device and the chassis-ground; and
 wherein the one or more circuit cards are adapted to a connect to a battery, wherein the battery is connected to the chassis-ground.

2. The electronic system of claim 1, wherein each of the one or more circuit cards is connected to a backplane.

3. The electronic system of claim 1, wherein a backplane connects the single ground plane to the chassis-ground.

4. The electronic system of claim 1, wherein a conductive strip of the circuit card connects the single ground plane to the chassis-ground.

5. The electronic system of claim 1, wherein the battery is connected to a power supply of each of the one or more circuit cards.

6. The electronic system of claim 1, wherein the single ground plane comprises one or more conductive layers and traces of the respective one of each of the one or more circuit cards.

7. The electronic system of claim 1, wherein the single ground plane comprises a plurality of electrically interconnected conductive layers of the respective one of each of the one or more circuit cards.

8. A circuit card comprising:
 a single ground plane connectable to a chassis-ground;
 a logic device having a ground pin connected to the single ground plane, wherein the connection between the ground pin and the single ground plane provides a direct path between the logic device and the chassis-ground;
 a power supply connected to an input pin of the logic device for providing a logic voltage to the logic device, the power supply connectable to a battery.

9. The circuit card of claim 8, wherein the circuit card is connectable to a backplane, the backplane adapted to connect the single ground plane to the chassis-ground.

10. The circuit card of claim 8, further comprising a conductive strip adapted to connect the single ground plane to the chassis-ground.

11. The circuit card of claim 8, wherein the single ground plane comprises one or more of conductive layers and traces of the circuit card.

12. A circuit card comprising:
 an edge connector;
 a single ground plane connected to a ground pin of the edge connector, the ground pin connectable to a chassis-ground for connecting the single ground plane to the chassis-ground;
 a logic device having a ground pin connected to the single ground plane, wherein the connection between the ground pin of the logic device and the single ground plane provides a direct path between the logic device and the chassis-ground;
 a power supply connected to an input pin of the logic device for providing a logic voltage to the logic device, the power supply having a battery pin and a battery-return respectively connected to a battery pin and a battery-return pin of the edge connector for connecting the power supply to a battery.

13. The circuit card of claim 12, wherein the edge connector is connectable to a backplane.

14. The circuit card of claim 12, wherein the single ground plane comprises one or more of conductive layers and traces of the circuit card.

15. The circuit card of claim 12, further comprising a conductive strip adapted to connect the single ground plane to the chassis-ground.

16. A circuit card comprising:
 a substrate;
 a single ground plane comprising one or more conductive layers disposed on a surface of the substrate, wherein the single ground plane is connectable to a chassis-ground;
 a logic device disposed on the surface of the substrate and having a ground pin connected to the single ground plane, wherein the connection between the ground pin and the single ground plane provides a direct path between the logic device and the chassis-ground; and
 a power supply disposed on the surface of the substrate, the power supply connected to an input pin of the logic device for providing a logic voltage to the logic device, the power supply connectable to a battery.

17. The circuit card of claim 16, wherein the circuit card is connectable to a backplane, the backplane adapted to connect the single ground plane to the chassis-ground.

18. The circuit card of claim 16, further comprising a conductive strip adapted to connect the single ground plane to the chassis-ground.

19. The circuit card of claim 16, wherein the single ground plane further comprises one or more conductive layers disposed within the substrate.

20. A circuit card comprising:

a substrate;

a single ground plane comprising one or more conductive layers disposed within the substrate, wherein the single ground plane is connectable to a chassis-ground;

a logic device disposed on a surface of the substrate and having a ground pin connected to the single ground plane, wherein the connection between the ground pin and the single ground plane provides a direct path between the logic device and the chassis-ground; and a power supply disposed on the surface of the substrate, the power supply connected to an input pin of the logic device for providing a logic voltage to the logic device, the power supply connectable to a battery.

21. The circuit card of claim 20, wherein the circuit card is connectable to a backplane, the backplane adapted to connect the single ground plane to the chassis-ground.

22. The circuit card of claim 20, further comprising a conductive strip adapted to connect the single ground plane to the chassis-ground.

* * * * *